(12) United States Patent
Deng

(10) Patent No.: US 12,225,831 B2
(45) Date of Patent: Feb. 11, 2025

(54) SUPERCONDUCTING QUBIT AND PREPARATION METHOD THEREOF, QUANTUM STORAGE DEVICE, AND QUANTUM COMPUTER

(71) Applicant: ALIBABA GROUP HOLDING LIMITED, Grand Cayman (KY)

(72) Inventor: Hao Deng, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 119 days.

(21) Appl. No.: 17/505,086

(22) Filed: Oct. 19, 2021

(65) Prior Publication Data
US 2022/0131064 A1    Apr. 28, 2022

(30) Foreign Application Priority Data

Oct. 27, 2020  (CN) .......................... 202011166998.4

(51) Int. Cl.
| H10N 60/01 | (2023.01) |
| G06N 10/00 | (2022.01) |
| H10N 60/12 | (2023.01) |
| H10N 60/80 | (2023.01) |
| H10N 60/83 | (2023.01) |

(52) U.S. Cl.
CPC ......... *H10N 60/0912* (2023.02); *G06N 10/00* (2019.01); *H10N 60/0884* (2023.02); *H10N 60/12* (2023.02); *H10N 60/805* (2023.02); *H10N 60/83* (2023.02)

(58) Field of Classification Search
CPC ........................... H10N 60/0912; H10N 60/12
See application file for complete search history.

(56) References Cited

U.S. PATENT DOCUMENTS

| 10,720,563 | B1 | 7/2020 | Jeffrey et al. | |
| 2002/0011785 | A1* | 1/2002 | Tang | H10K 59/122 |
| | | | | 313/506 |
| 2003/0102470 | A1 | 6/2003 | Il'ichev et al. | |
| 2005/0123674 | A1* | 6/2005 | Stasiak | B82Y 10/00 |
| | | | | 505/410 |
| 2009/0057652 | A1 | 3/2009 | Nevirkovets et al. | |
| 2011/0151190 | A1* | 6/2011 | Chung | B82Y 10/00 |
| | | | | 977/773 |
| 2019/0259931 | A1 | 8/2019 | Megrant | |
| 2019/0273196 | A1 | 9/2019 | Marcus et al. | |
| 2020/0006421 | A1 | 1/2020 | Ladizinsky et al. | |
| 2020/0078015 | A1 | 3/2020 | Miller et al. | |
| 2020/0328339 | A1 | 10/2020 | Shabani et al. | |

OTHER PUBLICATIONS

PCT International Search Report and Written Opinion mailed Jan. 21, 2022, issued in corresponding International Application No. PCT/US2021/055567 (13 pgs.).

\* cited by examiner

*Primary Examiner* — Matthew L Reames
(74) *Attorney, Agent, or Firm* — Finnegan, Henderson, Farabow, Garrett & Dunner, LLP

(57) ABSTRACT

The present disclosure provides a superconducting qubit. The superconducting qubit includes: a Josephson junction and a non-Josephson junction area, wherein the non-Josephson junction area includes a first layer of superconducting material, the first layer of superconducting material being superconducting material deposited on the non-Josephson junction area before ion milling on the Josephson junction and the non-Josephson junction area during preparation of the superconducting qubit.

6 Claims, 10 Drawing Sheets

SUPERCONDUCTING QUBIT AND PREPARATION METHOD THEREOF, QUANTUM STORAGE DEVICE, AND QUANTUM COMPUTER

CROSS-REFERENCE TO RELATED APPLICATIONS

The disclosure claims the benefits of priority to Chinese Application No. 202011166998.4, filed on Oct. 27, 2020, which is incorporated herein by reference in its entirety.

TECHNICAL FIELD

The present disclosure relates to the field of quantum computing, and in particular, to a superconducting qubit and a preparation method thereof, a quantum storage device, and a quantum computer.

BACKGROUND

A superconducting qubit includes a Josephson junction and non-Josephson junction area. Reducing the loss of a superconducting qubit is one of the keys to realizing reliable superconducting quantum computing. In the process of preparing a superconducting qubit, the preparation of Josephson junction that is the core part of the superconducting qubit, requires in-situ treatment on a substrate surface using the ion milling process to improve the performance and controllability of the Josephson junction. But at the same time, ion milling will damage the substrate surface of the non-Josephson junction area (e.g., including a capacitor electrode) of the superconducting qubit.

Therefore, in the existing preparation method of a superconducting qubit, treating the substrate surface with the ion milling process will bring considerable dielectric loss and reduce the life of the superconducting qubit.

SUMMARY OF THE DISCLOSURE

Embodiments of the present disclosure provide a superconducting qubit. The superconducting qubit includes: a Josephson junction and a non-Josephson junction area, wherein the non-Josephson junction area includes a first layer of superconducting material, the first layer of superconducting material being superconducting material deposited on the non-Josephson junction area before ion milling on the Josephson junction and the non-Josephson junction area during preparation of the superconducting qubit.

Embodiments of the present disclosure provide a preparation method of a superconducting qubit using a mask structure used to determine a Josephson junction and a non-Josephson junction area. The method includes: depositing a first layer of superconducting material on the non-Josephson junction area; performing ion milling on the Josephson junction and the non-Josephson junction area; preparing a Josephson junction first layer electrode, a Josephson junction insulating layer, and a Josephson junction second layer electrode; and removing the mask structure to obtain the superconducting qubit.

Embodiments of the present disclosure provide a quantum storage device. The quantum storage device includes a superconducting qubit, wherein the superconducting qubit is prepared by the preparation method described above.

Embodiments of the present disclosure provide a quantum computer. The quantum computer includes a superconducting qubit, wherein the superconducting qubit is prepared by the preparation method described above.

Embodiments of the present disclosure provide a quantum computer. The quantum computer includes a superconducting qubit described above.

BRIEF DESCRIPTION OF THE DRAWINGS

Embodiments and various aspects of the present disclosure are illustrated in the following detailed description and the accompanying figures. Various features shown in the figures are not drawn to scale.

DETAILED DESCRIPTION

Figure 1:
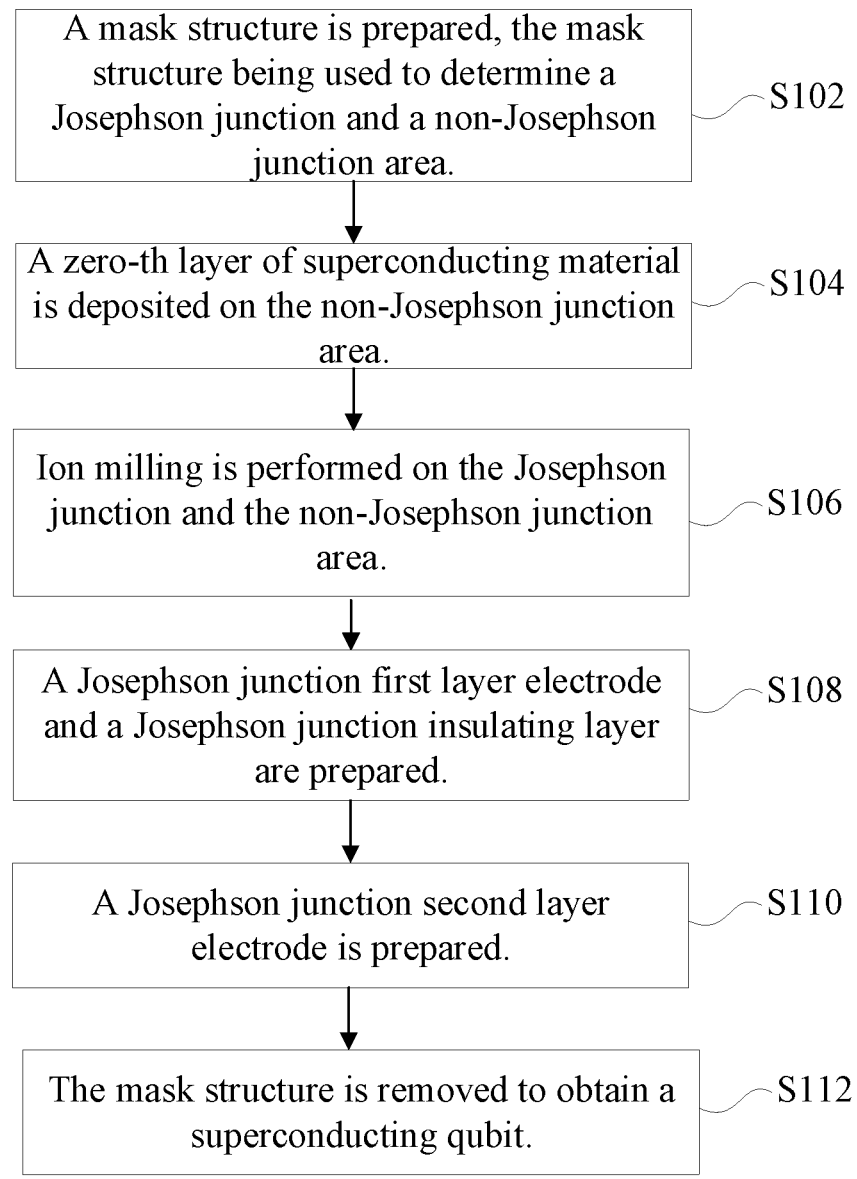
FIG. 1 illustrates a flow chart of a preparation method of a superconducting qubit according to some embodiments of the present disclosure.

Reference can now be made in detail to example embodiments, examples of which are illustrated in the accompanying drawings. The following description refers to the accompanying drawings in which the same numbers in different drawings represent the same or similar elements unless otherwise represented. The implementations set forth in the following description of example embodiments do not represent all implementations consistent with the disclosure. Instead, they are merely examples of apparatuses and methods consistent with aspects related to the disclosure as recited in the appended claims. Particular aspects of present disclosure are described in greater detail below. The terms and definitions provided herein control, if in conflict with terms and/or definitions incorporated by reference.

Before continuing with a detailed description of the exemplary embodiments, a variety of explanations for terms or words should be made.

In a preparation method of superconducting qubit, conventionally, ion milling is used before deposition of a first layer of superconducting material (e.g., an Aluminum (Al) layer). Ion milling involves milling solid surfaces with ion beams, such as thinning materials or cleaning surfaces on the micro-nano scale by ion beam bombardment. While ion milling can provide very high surface machining accuracy and small surface damage, the iron milling process has no selective power for areas and can act without distinction on all structural areas that are not covered by a photoresist (PR) after photolithography processing. Photoresist (PR) is an organic compound whose solubility in a developing solution will change after exposed to ultraviolet light. The PR used in silicon wafer manufacturing is coated on the surface of the silicon wafer in a liquid state, and then dried into a coating. This method can cause great damage to the substrate surface of the non-Josephson junction area. After the superconducting material layer is deposited on the damaged substrate surface, there can be considerable dielectric loss on the surface, which reduces the life of the superconducting qubit.

In another preparation method of superconducting qubit, a large-size non-Josephson junction area is firstly prepared using an additional pattern transfer process, and then a Josephson junction is prepared separately. Ion milling process is only applied on the Josephson junction preparation. This method avoids the damage of ion milling to the substrate surface of the non-Josephson junction area, but the process complexity is significantly increased. A series of additional processes are required, such as superconducting material layer deposition-photolithography-corroding/etching-mask removal, or photolithography-superconducting material layer deposition-lift off, which increase the process steps and reduce the yield. At the same time, the separately prepared Josephson junction and the large-size non-Josephson junction area prepared previously need to be well electrically connected, and there is a potential contact resistance problem, which may require more additional processes to solve.

In view of the above problems, in some embodiments of present disclosure, a preparation method of superconducting qubit with low-loss is proposed, which prevents the substrate surface of the non-Josephson junction area of the superconducting qubit from being damaged by the ion milling process. Therefore, the dielectric loss of the substrate surface of the non-Josephson junction area can be effectively reduced, and it is not only directly helpful to improving the superconducting qubit performance, but also to extending the life of the superconducting qubit.

FIG. 1 is a flow chart of a preparation method of a superconducting qubit according to some embodiments of the present disclosure. As shown in FIG. 1, the preparation method includes steps S102 to S112. FIGS. 2A to 2F illustrate schematic diagram of steps S102 to S112 (as shown in FIG. 1) respectively in a preparation method of a superconducting qubit according to some embodiments of the present disclosure. In each FIGS. 2A to 2F, a schematic diagram illustrated in an XYZ coordinate system and a schematic diagram illustrated in an X-Y plan of the XYZ coordinate system are presented. The same number refers to a same or similar process or component.

With reference to FIG. 1, at step S102, a mask structure is prepared, the mask structure being used to determine a Josephson junction and a non-Josephson junction area. In a photolithography semiconductor manufacturing process, a mask can be used as a negative film. For example, the role of a mask is to cover an opaque pattern template in a selected area of a silicon wafer, so that the subsequent corrosion or diffusion may only affect the area outside the selected area. An image mask is similar to the mask, with selected images, graphics, or objects that are used to cover (all or some of) to-be-processed images to control the area of the image processing or the process.

Figure 2A:
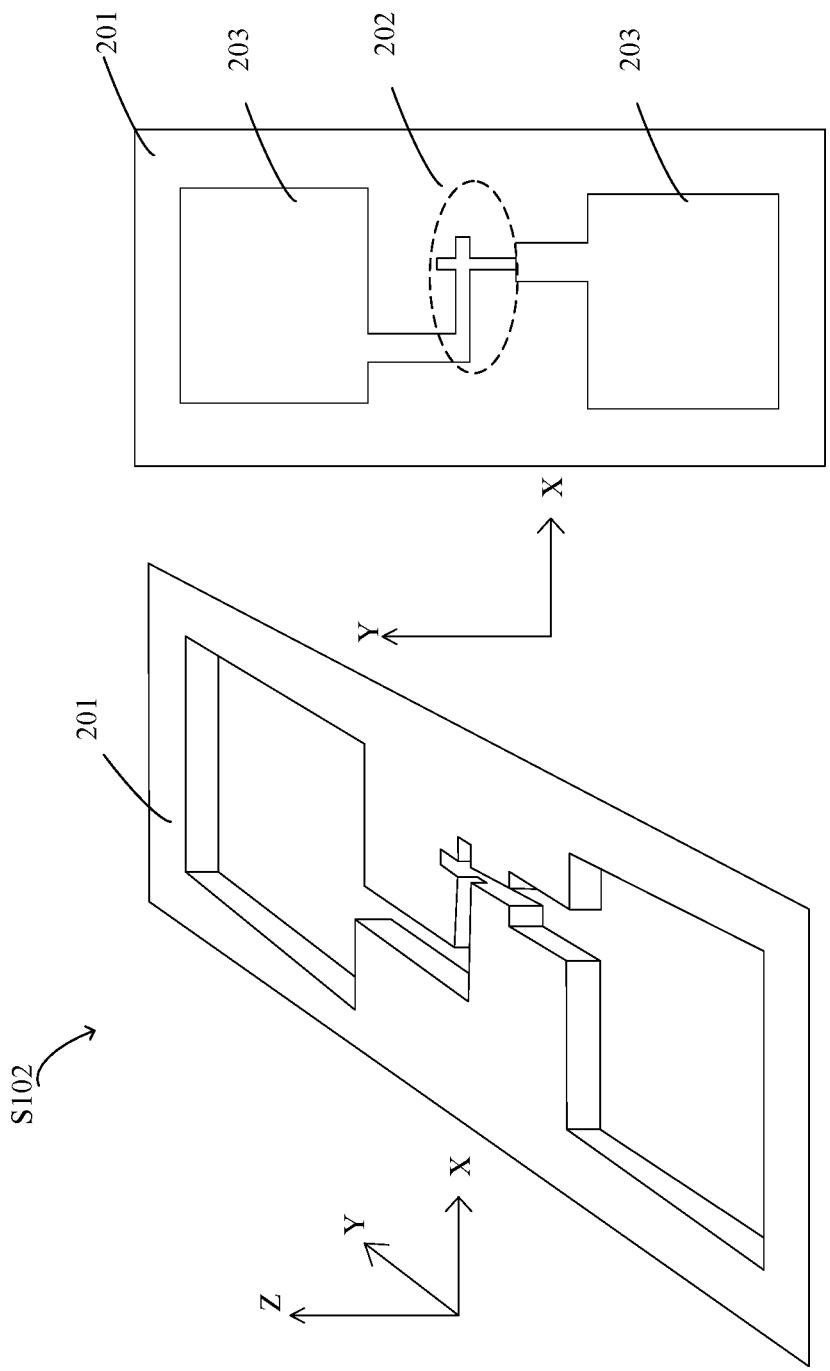
FIGS. 2A to 2F illustrate schematic diagram of steps S102 to S112 as shown in FIG. 1, respectively, according to some embodiments of the present disclosure.

For instance, FIG. 2A provides an example mask structure 201. In this example, mask structure 201 is prepared and can be used by a lift off process (which can involve a pattern transfer method used in micro-nano machining). Mask structure 201 can include a Josephson junction 202 (e.g., a fine crosses) and other large-size area 203 (e.g., a non-Josephson junction area). In some embodiments of the present disclosure, the mask is made of photoresist (PR) for example. In some embodiments, other ways such as electron beam lithography (EBL) photoresist or inorganic material may also be used. The material of the mask structure may include a variety of types of materials, for example, one or more of photoresist, electron beam lithography (EBL) photoresist, and inorganic material. The materials of the mask structure listed here are not exhaustive, and those skilled in the art may select other materials as needed.

Referring back to FIG. 1, at step S104, a zero-th layer of superconducting material is deposited on the non-Josephson junction area. When depositing the zero-th layer of superconducting material on the non-Josephson junction area, a variety of ways may be used. For example, the deposition may be achieved in the following manner: in a spatial XYZ coordinate system where the superconducting qubit is located, depositing the zero-th layer L0 of superconducting material in an X-Y plane in a direction that is at a first angle with an X axis and at a second angle with a Z axis, so that the Josephson junction is blocked under shadow effect of the mask with no superconducting material deposited thereon. Therefore, superconducting material is deposited on the non-Josephson junction area and not deposited on the Josephson junction. Through the above process, according to the selection of the first angle and second angle, no superconducting material is deposited on the Josephson junction while superconducting material is deposited on the non-Josephson junction area during deposition of the zero-th layer of superconducting material. Therefore, during subsequent ion milling, the non-Josephson junction area is protected by the deposited superconducting material, and the dielectric loss of the non-Josephson junction area is avoided.

Figure 2B:
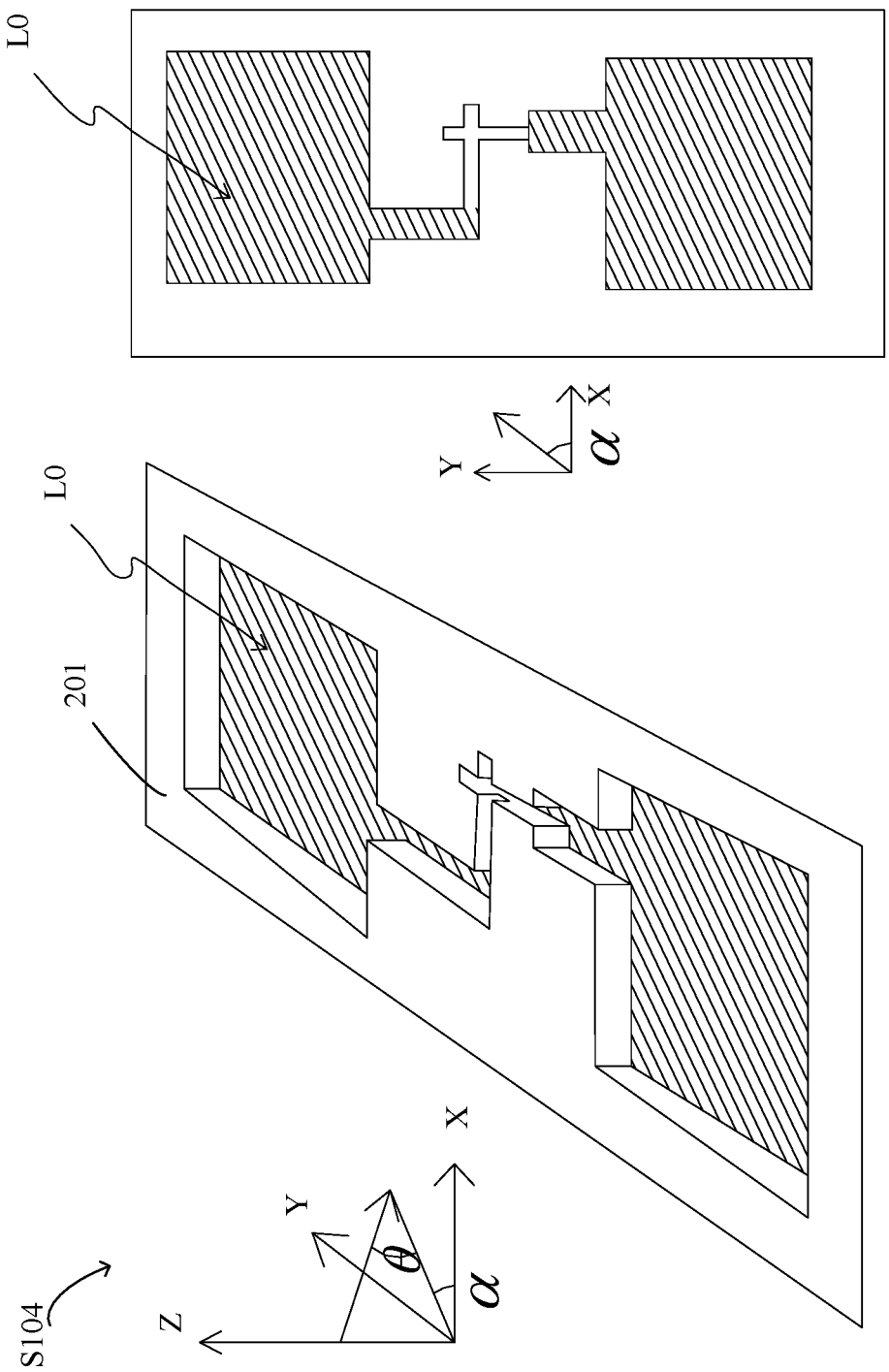

For instance, referring to FIG. 2B, a zero-th layer L0 (e.g., shown in FIG. 2B with oblique lines inclined to the left) of superconducting material is deposited in the X-Y plane in a direction that is at an alpha ($\alpha$) angle with the X axis and a 90-theta (90-$\theta$) angle with the Z axis. By selecting the two angles, the Josephson junction is blocked by shadow effect of the mask and no superconducting material is deposited thereon.

Referring back to FIG. 1, at step S106, ion milling is performed on the Josephson junction and the non-Josephson junction area. The substrate surface of the Josephson junction is cleaned due to no superconducting material protection, and the non-Josephson junction area is protected by the zero-th layer of superconducting material. During ion milling of the Josephson junction and the non-Josephson junction area, controllable and varying degrees of ion milling strength is applied in different areas when ion milling is performed on the non-Josephson junction area. As a result, the thickness of the zero-th layer of superconducting material prepared on the non-Josephson junction area may be different. For example, according to different design, by adjusting the thickness of the zero-th layer of superconducting material, ion milling may be performed in part on the substrate surface of the non-Josephson junction area when the zero-th layer is etched away by ion milling, so as to apply controllable and varying degrees of ion milling strength in different areas. Alternatively, by depositing the zero-th layer of superconducting material step by step at different angles, it is possible to achieve that the thickness of the zero-th layer of superconducting material at positions where there are components in the non-Josephson junction area is greater than that at positions where there are no components in the non-Josephson junction area. Alternatively, if the thickness of the zero-th layer of superconducting material on the entire non-Josephson junction area is the same, when ion milling is performed on the non-Josephson junction area, the ion milling strength may be lower for positions where there are components, and higher for positions where there are no components.

Figure 2C:
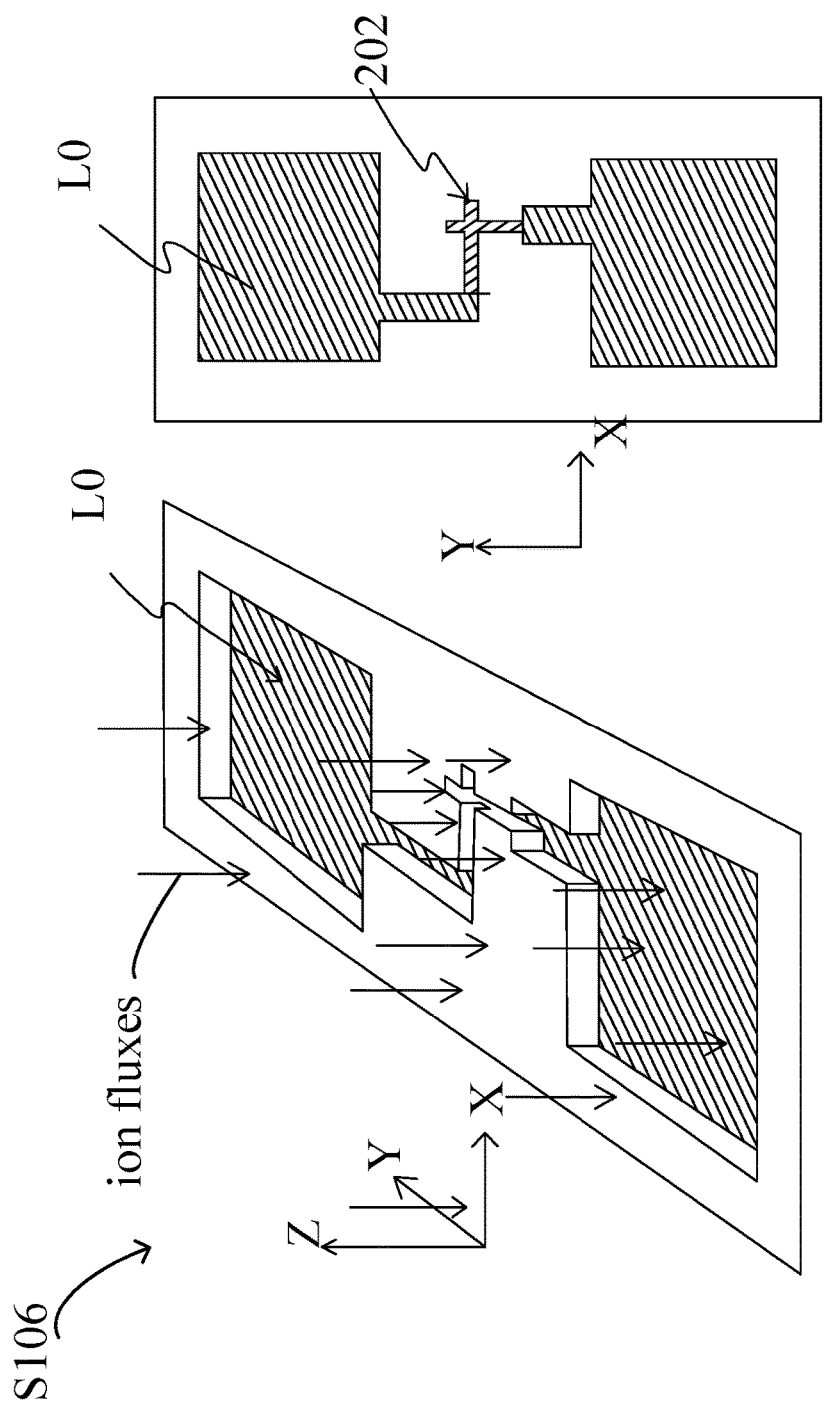

For instance, referring to FIG. 2C, ion milling process (ion fluxes are represented with downward arrows in FIG.

2C) is performed on the Josephson junction and the non-Josephson junction area. In some embodiments, an Ar ion is used in the ion milling process. Since the Josephson junction 202 is not protected by superconducting material, the substrate surface of the Josephson junction 202 (e.g., shown in FIG. 2C with oblique lines inclined to the right) is cleaned. The large-size non-Josephson junction area 203 is protected by the zero-th layer L0 of superconducting material, and the substrate surface of the large-size non-Josephson junction area 203 is protected.

Referring back to FIG. 1, at step S108, a Josephson junction first layer electrode and a Josephson junction insulating layer are prepared. The Josephson junction first layer electrode may be prepared in a variety of ways. For instance, referring to FIG. 2D, the preparation can be achieved in the following manner: in a spatial XYZ coordinate system where the superconducting qubit is located, preparing the Josephson junction first layer electrode by depositing a first layer L1 of superconducting material in an X-Y plane in a direction that is parallel to the X axis and at a third angle with the Z axis. With the selection of the above third angle, the Josephson junction first layer electrode is prepared by the first layer L1 of superconducting material deposited.

The Josephson junction insulating layer may also be prepared in a variety of ways. For example, the Josephson junction insulating layer may be prepared by one of the following methods: producing an oxide by oxidation reaction; forming a PVD coating by physical vapor deposition (PVD); synthesizing a CVD coating by chemical vapor deposition (PVD); and forming an ALD deposition film by atomic layer deposition (ALD).

Figure 2D:
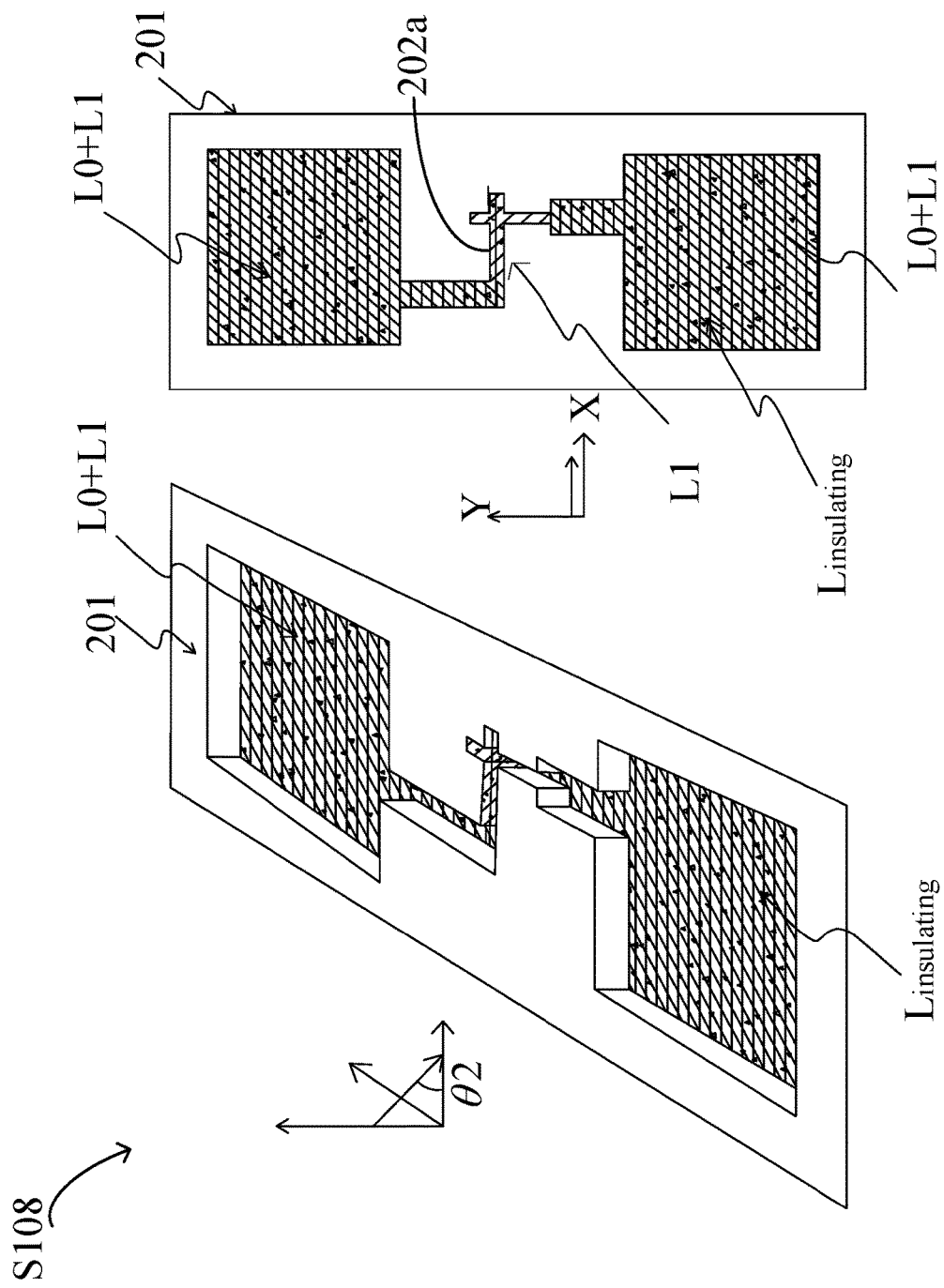
Figure 2E:
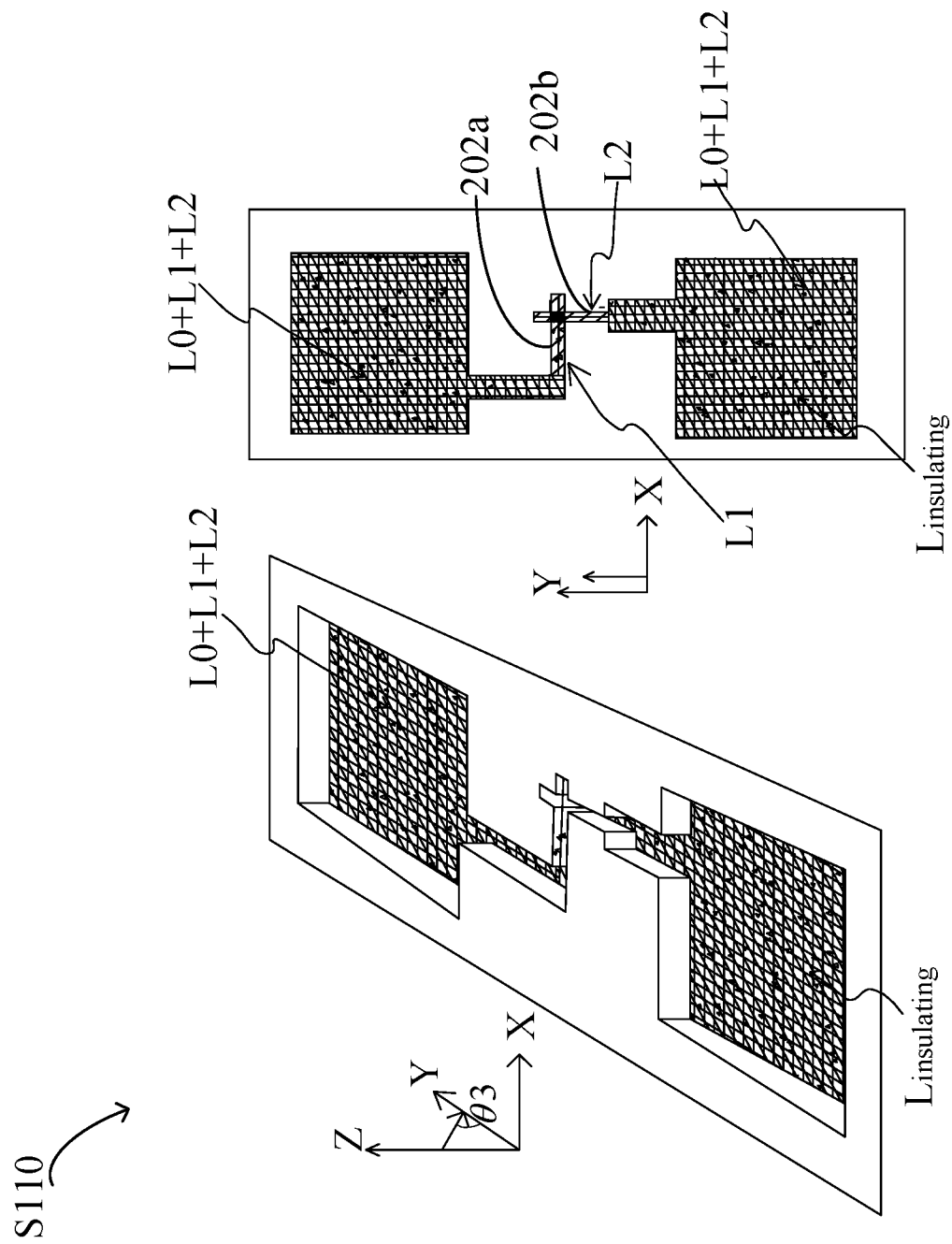

For instance, a first layer L1 of superconducting material is deposited in the X-Y plane in a direction that is parallel to the X axis and at a 90-theta2 (90-$\theta_2$) angle with the Z axis. As shown in FIG. 2D, the zero-th layer L0 on the non-Josephson junction area (shown with oblique lines inclined to the left) added with horizontal lines represent zero-th layer plus a first layer (e.g., L0+L1). On the Josephson junction 202, which is represented by oblique lines inclined to the right (i.e., the ion milling cleaned surface), a Josephson junction first layer electrode is prepared on a first Josephson junction area 202a (shown with horizontal lines added to the oblique lines inclined to the right), which is an area parallel to the X axis. Due to the angle of the deposition, only the part parallel to the X axis has the first layer L1, so in FIG. 2D, only the part parallel to the X axis has the horizontal line (i.e., the first Josephson junction area 202a). As show in FIG. 2D, an insulating layer $L_{insulating}$ (shown in FIG. 2D with dots) is added on the first Josephson junction area 202a and non-Josephson junction area 201, after the first layer L1 is deposited. In some embodiments, the insulation layer is an oxide layer, and oxidation is taken as an example for preparation of the Josephson junction insulating layer. In some embodiments, other methods such as physical vapor deposition (PVD), chemical vapor deposition (CVD), and atomic layer deposition (ALD) may also be used. It could be understood that, in some embodiments, the insulation layer can be prepared on the whole surface of the exposed area, including the second Josephson junction area 202b.

Referring to FIG. 1, at step S110, a Josephson junction second layer electrode is prepared. The preparation of the Josephson junction second layer electrode is similar to that of the Josephson junction first layer electrode, both of which may be realized in a variety of ways. For example, the preparation may be achieved by depositing the second layer of superconducting material in the X-Y plane in a direction that is parallel to Y axis and at a fourth angle with the Z axis. For instance, referring to FIG. 2E, a second layer L2 (shown in FIG. 2E with vertical lines) of superconducting material in the X-Y plane in a direction that is parallel to the Y axis and at a 90-theta3 (90-$\theta_3$) angle with the Z axis is deposited. The area with L0+L1+L2 is represented the oblique lines inclined to the left (e.g., L0) plus the horizontal lines (e.g., L1) plus the vertical lines (e.g., L2). On the Josephson junction 202, which is represented by the oblique lines inclined to the right (i.e., the ion milling cleaned surface), a Josephson junction second layer electrode is prepared on a second Josephson junction area 202b (shown with vertical lines added to the oblique lines inclined to the right), which is an area parallel to the Y axis. Due to the angle of the deposition, only the part parallel to the Y axis has the L2 layer, thus, in FIG. 2E, only the part parallel to the Y axis has the vertical line (i.e., the second Josephson junction area 202b).

It could be understood that, in some embodiments, a Josephson junction first layer electrode and an insulating layer could be prepared on the second Josephson junction area 202b first, and then a Josephson junction second layer electrode could be prepared on the first Josephson junction area 202a, by the angle selections in step S108 and S110 during the preparation.

Figure 2F:
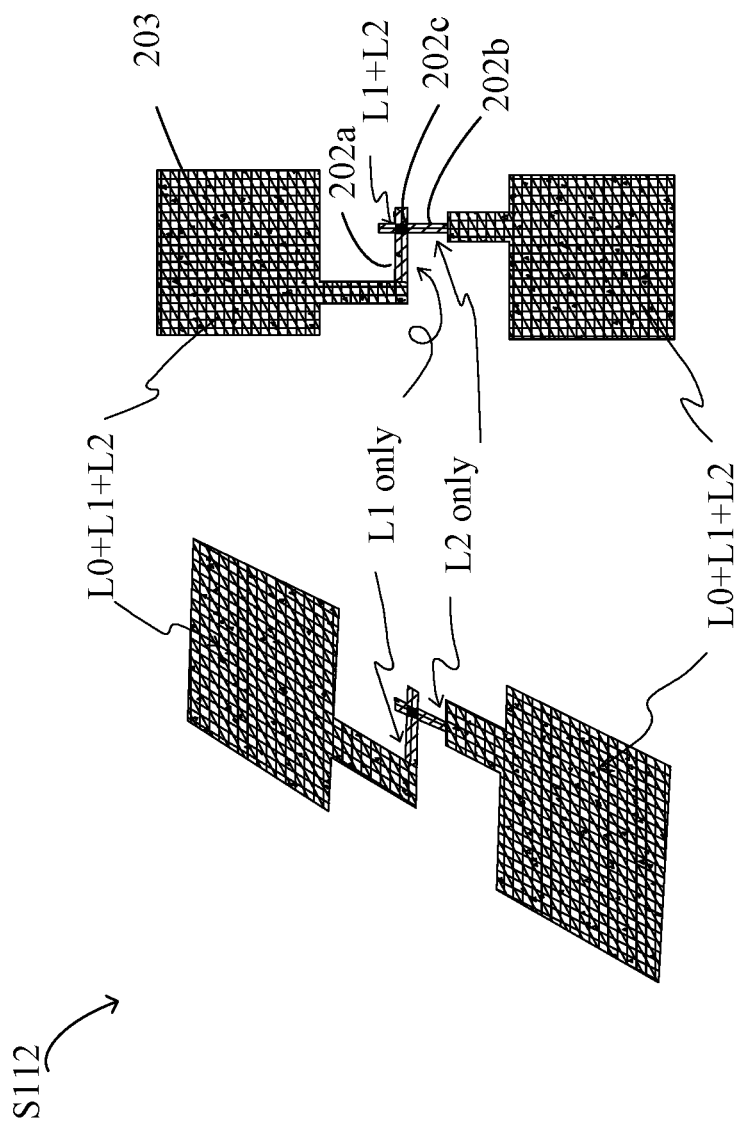

Referring to FIG. 1, at step S112, the mask structure is removed to obtain a superconducting qubit. In some embodiments, the mask layer is removed and all structures are released by lift off. Therefore, the preparation of the superconducting qubit is completed. Referring to FIG. 2F, the mask structure 201 of FIG. 2A has been removed. The non-Josephson junction area 203 is prepared with the zero-th layer L0, the first layer L1, the insulating layer $L_{insulating}$ and the second layer L2. The first Josephson junction area 202a is prepared with the first layer L1 and the insulating layer $L_{insulating}$, and the second Josephson junction area 202b is prepared with the second layer L2. A cross area 202c of the first Josephson junction area 202a and the second Josephson junction area 202b is prepared with the first layer L1, the insulating layer $L_{insulating}$, and the second layer L2, where a Josephson junction behavior is performed.

By depositing superconducting material on the non-Josephson junction area before ion milling on the Josephson junction and the non-Josephson junction area (e.g., a zero-th layer of superconducting material prepared on the non-Josephson junction area), the substrate surface of the non-Josephson junction area is protected, thus avoiding damage to the substrate surface of the non-Josephson junction area, reducing the dielectric loss of the substrate surface of the non-Josephson junction area, achieving the technical effect of improving the life of the superconducting qubit, and then solving the technical problem of treating a substrate surface using the ion milling process in a superconducting qubit preparation method in the prior art will bring considerable dielectric loss and reduce the life of the superconducting qubit.

In some embodiments, the superconducting materials used by the zero-th layer of superconducting material, the first layer electrode, and the second layer electrode may all be of a variety of types. For example, they may include one or more of Aluminum (Al), Tantalum (Ta), Niobium (Nb), or Titanium nitride (TiN).

It should be noted that the superconducting materials used in these embodiments may be of a variety of types. In some embodiments of the present disclosure, Al is taken as an example for illustration, and in some embodiments, other superconducting materials, such as Ta, Nb, and TiN, may also be used.

With the method described above, using triple superconducting material layer projection deposition, the substrate surface of a large-area structure area in the non-Josephson junction area is protected by the zero-th layer of superconducting material, before the ion milling process. The damage of ion milling to the substrate surface of the area is avoided, thereby reducing the dielectric loss of the ion milling process on the substrate surface of the area, and improving the life of the superconducting qubit. At the same time, it may not be necessary to add additional non-in-situ process steps, which can help maintain the simplicity of the process and improve the yield.

In addition, with the method described above, no additional process is required to prepare the non-Josephson junction structure, and all process steps are performed in situ. The number of patterning is the least (only once), which maintains the simplicity of the process and improves the yield. At the same time, Josephson junction is integrated with other structures, and there are no electrical contact issues.

It should be noted that, for the sake of simplicity, the foregoing method embodiments are all expressed as a series of action combinations, but those skilled in the art should know that the present disclosure is not limited by the order of actions described, because some steps may be performed in another order or simultaneously according to the present disclosure. Secondly, those skilled in the art should also know that the embodiments described in the specification are all preferred embodiments, and the actions and modules involved are not necessarily required by the present disclosure.

From the description of the above implementations, those skilled in the art may clearly understand that the methods according to the above embodiments may be implemented by means of software plus a necessary general hardware platform, and definitely may also be implemented by hardware, but the former is a better implementation in most cases. Based on such an understanding, the technical solutions of the present disclosure essentially or the part making contributions to the prior art may be embodied in the form of a software product. The software product may be stored in a storage medium and include several instructions used for causing a terminal device to execute the methods in various embodiments of the present disclosure.

Figure 3:
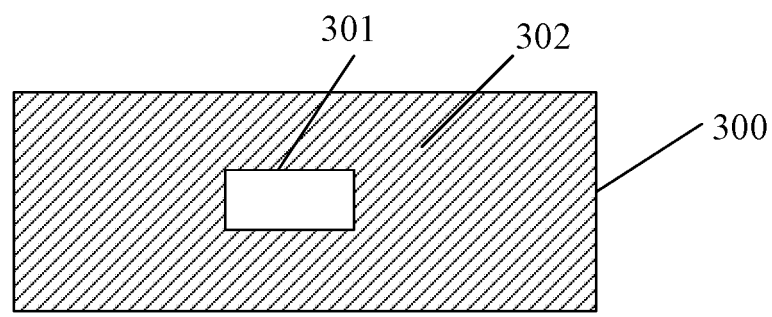
FIG. 3 is a schematic structural diagram of a superconducting qubit according to some embodiments of the present disclosure.

In some embodiments of the present disclosure, a superconducting qubit is provided. FIG. 3 is a schematic structural diagram of a superconducting qubit according to some embodiments of the present disclosure. As shown in FIG. 3, a superconducting qubit 300 includes Josephson junction 301 and non-Josephson junction area 302, wherein non-Josephson junction area 302 includes a zero-th layer of superconducting material (shown with shaded), and the zero-th layer of superconducting material is superconducting material deposited on the non-Josephson junction area 302 before ion milling on the Josephson junction 301 and the non-Josephson junction area 302 during preparation of the superconducting qubit.

In some embodiments of the present disclosure, by depositing superconducting material on the non-Josephson junction area before ion milling of the Josephson junction and the non-Josephson junction area, a zero-th layer of superconducting material is prepared on the non-Josephson junction area. Therefore, the substrate surface of the non-Josephson junction area is protected, thus avoiding damage to the substrate surface of the non-Josephson junction area, reducing the dielectric loss of the substrate surface of the non-Josephson junction area, achieving the technical effect of improving the life of the superconducting qubit, and then solving the technical problem of treating a substrate surface using the ion milling process in a superconducting qubit preparation method in the prior art will bring considerable dielectric loss and reduce the life of the superconducting qubit.

In some embodiments, the superconducting material of the zero-th layer of superconducting material may include a variety of types of materials, including, for example, one or more of Al, Ta, Nb, or TiN. It should be noted that the superconducting materials listed above are not exhaustive, and other superconducting materials that can be used by those skilled in the art according to their knowledge in the art to avoid damage to the substrate surface of the non-Josephson junction area also belong to this application.

In some embodiments, after the ion milling of the Josephson junction and the non-Josephson junction area, the Josephson junction includes a Josephson junction first layer electrode deposited from a first layer of superconducting material, a Josephson junction insulating layer, and a Josephson junction second layer electrode deposited from a second layer of superconducting material. Therefore, after a mask structure is prepared, ion milling is performed on the Josephson junction and the non-Josephson junction area following superconducting material deposited on the non-Josephson junction area (e.g., the zero-th layer of superconducting material). The substrate surface of the Josephson junction is cleaned due to no superconducting material protection, while the non-Josephson junction area is protected by the zero-th layer of superconducting material, thereby effectively avoiding damage to the substrate surface of the non-Josephson junction area and reducing the dielectric loss of the substrate surface of the non-Josephson junction area.

In some embodiments, the thickness of the zero-th layer of superconducting material prepared on the non-Josephson junction area is different. For example, according to design, by adjusting the thickness of the zero-th layer of superconducting material, ion milling may be performed in part on the substrate surface of the non-Josephson junction area during the time when the zero-th protective layer is etched away by ion milling, so as to apply controllable and varying degrees of ion milling strength in different areas. Optionally, by depositing the zero-th layer of superconducting material step by step at different angles, it is possible to achieve that the thickness of the zero-th protective layer of superconducting material at positions where there are components on the non-Josephson junction area is greater than that at positions where there are no components on the non-Josephson junction area.

In some embodiments, the superconducting material of the first layer of superconducting material and the second layer of superconducting material is similar to the superconducting material of the zero-th layer of superconducting material; that is, the superconducting material of the first layer of superconducting material and the second layer of superconducting material is one or more of Al, Ta, Nb, or TiN.

In some embodiments, the Josephson junction insulating layer may also be obtained in a variety of ways. For example, the Josephson junction insulating layer may include one or more of an oxide produced by oxidation, a PVD coating formed by physical vapor deposition (PVD), a CVD coating synthesized by chemical vapor deposition (CVD), and an ALD deposition film formed by atomic layer deposition (ALD). It should be pointed out that the ways listed above are not exhaustive, and other materials that can realize the function of the Josephson junction insulating layer may be part of this application.

In some embodiments of the present disclosure, a quantum storage device is further provided. The quantum storage device stores quantum computing information using a superconducting qubit, wherein the superconducting qubit is prepared by the above-described preparation method of superconducting qubit.

In some embodiments of the present disclosure, a quantum computer is further provided, which includes: a quantum storage device and a quantum effector, wherein both the quantum storage device and the quantum effector conduct quantum manipulation through a quantum state constituted by a superconducting qubit according to any one of the above-mentioned embodiments.

Figure 4:
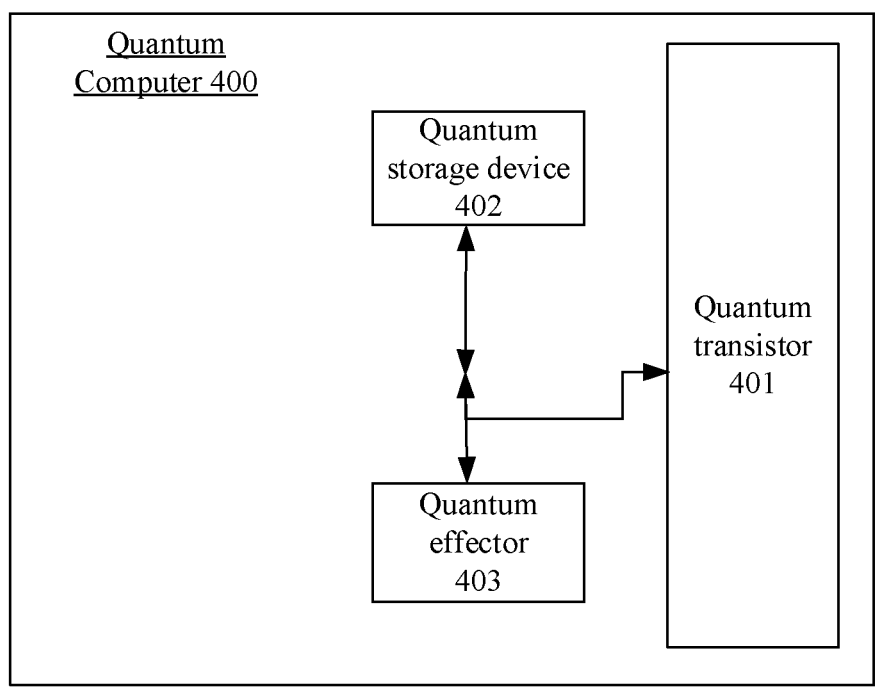
FIG. 4 is a schematic structural diagram of a quantum computer according to some embodiments of the present disclosure.

In some embodiments of the present disclosure, a quantum computer is further provided. FIG. 4 is a schematic structural diagram of a quantum computer 400 according to some embodiments of the present disclosure. As shown in FIG. 4, the quantum computer includes: a quantum transistor 401, a quantum storage device 402, and a quantum effector 403, all of which can communicate with one another. The quantum transistor 401 is configured to realize a switching function of a transistor, the quantum storage device 402 is configured to store quantum computing information, and the quantum effector 403 is configured to control quantum algorithms and quantum codes. The quantum transistor, all the quantum storage device, and the quantum effector conduct quantum manipulation through a quantum state constituted by a superconducting qubit 404. The superconducting qubit 404 includes a Josephson junction and a non-Josephson junction area. The non-Josephson junction area includes a zero-th layer of superconducting material, the zero-th layer of superconducting material being superconducting material deposited on the non-Josephson junction area before ion milling of the Josephson junction and the non-Josephson junction area during preparation of the superconducting qubit.

Optionally, the superconducting material of the zero-th layer of superconducting material includes one or more Al, Ta, Nb, or TiN.

Optionally, the Josephson junction includes a Josephson junction first layer electrode deposited from a first layer of superconducting material, a Josephson junction insulating layer, and a Josephson junction second layer electrode deposited from a second layer of superconducting material after the ion milling of the Josephson junction and the non-Josephson junction area.

Optionally, the superconducting materials of the first layer of superconducting material and the second layer of superconducting material include one or more Al, Ta, Nb, or TiN.

Optionally, the Josephson junction insulating layer includes one or more of an oxide produced by oxidation, a PVD coating formed physical vapor deposition (PVD), a CVD coating synthesized by chemical vapor deposition (CVD,) or an ALD deposition film formed by atomic layer deposition (ALD).

According to the embodiments of the present disclosure, by depositing superconducting material on the non-Josephson junction area before ion milling of the Josephson junction and the non-Josephson junction area, that is, preparing a zero-th layer of superconducting material on the non-Josephson junction area, the substrate surface of the non-Josephson junction area is protected, thus avoiding damage to the substrate surface of the non-Josephson junction area, reducing the dielectric loss of the substrate surface of the non-Josephson junction area, achieving the technical effect of improving the life of the superconducting qubit, and then solving the technical problem of treating a substrate surface using the ion milling process in a superconducting qubit preparation method in the prior art will bring considerable dielectric loss and reduce the life of the superconducting qubit.

Those of ordinary skill in the art may understand that the structure shown in FIG. 4 is merely for illustrative purposes, and FIG. 4 does not limit the structure of the above electronic apparatuses. For example, the quantum computer may also include more or fewer components than that shown in FIG. 4, or have a different configuration from that shown in FIG. 4.

Figure 5:
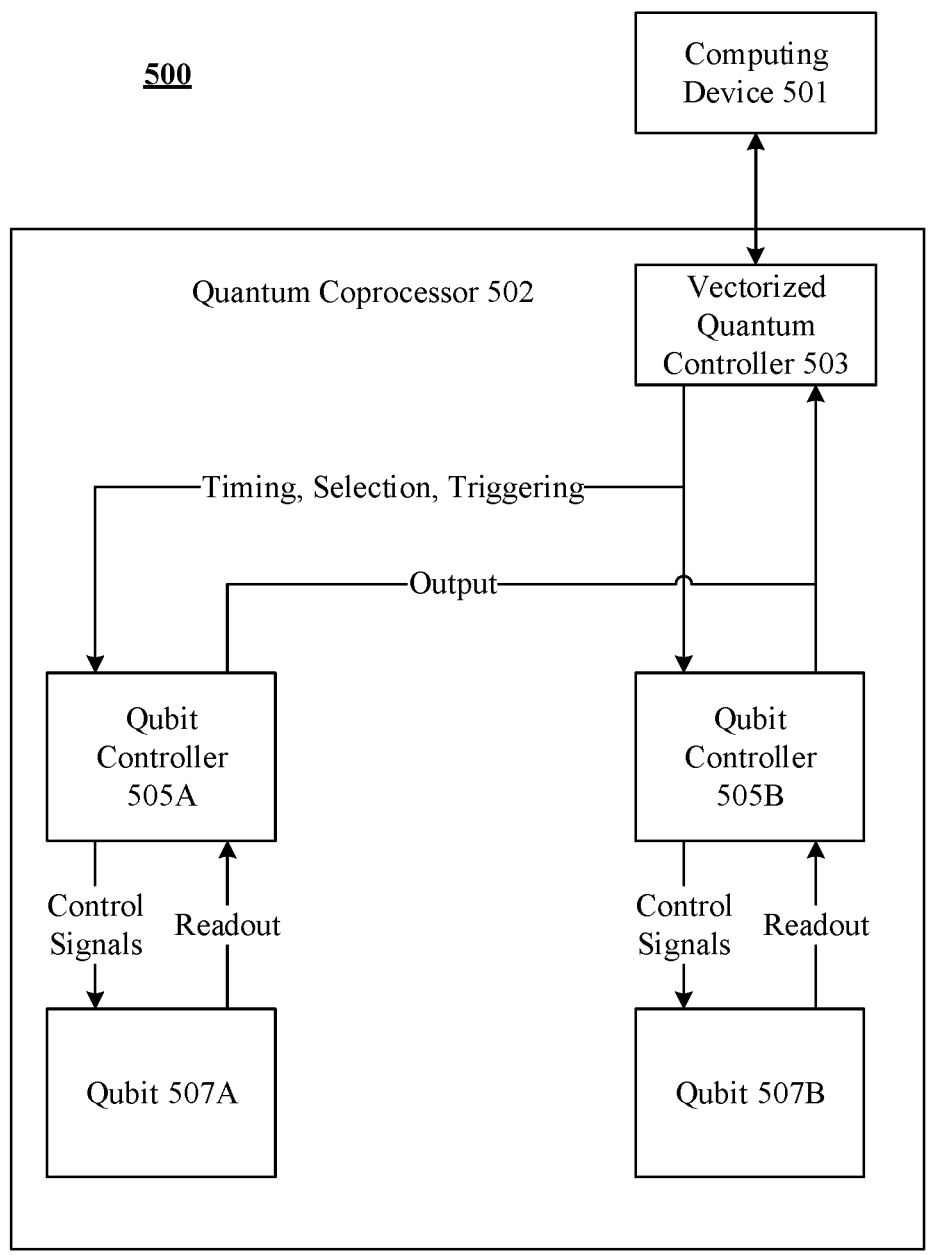
FIG. 5 is another schematic structural diagram of a quantum computer including a computing device and a quantum processor, according to some embodiments of the present disclosure.

FIG. 5 is another schematic structural diagram of a quantum computer 500 including a computing device and a quantum processor, in accordance with disclosed embodiments. Computing device 501 can be configured to provide instructions to quantum processor 502, which can implement these instructions using quantum operations to affect qubit states. In some instances, the instructions can be readout instructions. Quantum processor 502 can be configured to read out one or more qubit states in response to receiving such readout instructions. In this manner, quantum computer 500 can use quantum processor 502 to perform quantum computations that cannot be performed, or cannot be efficiently performed, using conventional computing devices.

Consistent with disclosed embodiments, computing device 501 can be a conventional digital computing device (e.g., a mobile device, laptop, desktop, workstation, computing cluster, or cloud-computing instance implemented on a cloud-computing platform), or a conventional portion of a computing device combining digital and quantum processors. The disclosed embodiments are not limited to any particular implementation for communications between computing device 501 and quantum processor 502. Consistent with disclosed embodiments, computing device 501 can be configured to communicate with quantum processor 502 using a bus (e.g., a PCI express bus, RapidIO, Hypertransport, QuickPath Interconnect, or other suitable standard) or using a network (e.g., using an ethernet connection or the like).

Consistent with disclosed embodiments, quantum processor 502 can include a vectorized quantum controller 503, one or more qubit controllers (e.g., qubit controller 505A and qubit controller 505B), and one or more qubits (e.g., qubit 507A and qubit 507B). The particular arrangement of qubit controllers and qubits depicted in FIG. 5 is not intended to be limiting. In some instances, for example, a qubit controller can be configured to control multiple qubits. Quantum processor 502 can include cryogenic systems for maintaining qubits at suitable temperatures for quantum computation. Quantum processor 502 can further include noise reducing filters disposed between qubit controller outputs and qubits, and low noise amplifiers disposed between qubit readouts and qubit controller inputs.

Consistent with disclosed embodiments, vectorized quantum controller 503 can be configured to communicate with computing device 501. In some instances, vectorized quantum controller 503 can receive instructions from computing device 501. Such instructions can include instructions to perform quantum gate(s) on qubit(s) or readout qubit state(s). Vectorized quantum controller 503 can be configured to convert such instructions into commands for qubit controllers. In some instances, such commands can specify which waveform to generate, a time to generate the waveform, or trigger the generation of a waveform, as described herein. In various instances, such commands can specify that a qubit controller readout the state of a qubit. The commands can then be provided to qubit controllers 505A and 505B, as shown. In some instances, for example in response to commands to readout a state of a qubit, vectorized quantum controller 503 can receive data from a qubit controller. In some instances, the state data can describe a measured state of the qubit (e.g., whether the qubit was in a state corresponding to "0" or the state corresponding to "1"). In some embodiments, the state data can describe a population of eigenstates of the qubit.

Consistent with disclosed embodiments, a qubit controller (e.g., qubit controller 505A or qubit controller 505B) can be configured to communicate with one or more qubits. The qubit controller can be or include one or more digital computing devices. In some embodiments, the qubit controller can include waveform generator(s), bias sources, microwave sources, or the like.

In some embodiments, the qubit controller can include a waveform generator output multiplexed with a microwave source and connected to an XY control line of a qubit. In some instances, the XY control line can be used to excite a state of the qubit.

In some embodiments, the qubit controller can include a waveform generator output connected to a Z control line of the qubit. A bias source can also be connected to the Z control line of the qubit. The waveform generator output and the bias source can provide signals to the Z control line to tune the qubit frequency.

In some embodiments, the qubit controller can include a waveform generator multiplexed with a microwave source and connected to a readout line of the qubit. The waveform generator can be configured to provide a probe signal to the readout line of the qubit. An analog to digital converter (ADC) can be connected to the readout line (e.g., to the other end of the readout line). The ADC can be configured to measure the signal output by the readout line in response to provision of the probe signal. The qubit controller can include the ADC. The qubit controller (or another component of the quantum processor, such as the vectorized quantum controller) can determine an amplitude and phase from the output signal. The amplitude and phase of the output signal can be used to determine the state of the probed qubit(s). The disclosed embodiments are not limited to any particular method of measuring the state of the qubits.

As described herein, a qubit controller can be configured to communicate with vectorized quantum controller 503. In some embodiments, the waveform generator(s) of the qubit controller can be configured to store multiple different pulse envelopes. These pulse envelopes may correspond to different quantum gates. The vectorized quantum controller 503 can provide the qubit controller a selection of gate(s) (or pulse envelope(s)) to provide to the qubit. In some embodiments, the waveform generator(s) can be configured to provide the selected gate(s) (or selected one or more pulse envelopes) at particular time(s). The disclosed embodiments are not limited to any particular method of indicating the times. In some embodiments, the time(s) can be indicated by a vector of timestamps. The timestamps can indicate a number of units (e.g., microseconds, clock ticks, or another suitable time unit) from initiation of stimulation until provision of pulse. In various embodiments, the waveform generators can be configured to initiate stimulation in response to a trigger command.

As a non-limiting example of communication between vectorized quantum controller 503 and a qubit controller, vectorized quantum controller 503 can indicate that the qubit controller shall provide a pulse corresponding to a Hadamard gate to the qubit, beginning 10 microseconds after initiation of stimulation. The vectorized quantum controller 503 can also provide a trigger signal to initiate stimulation. In some embodiments, the qubit controller can provide an acknowledgement signal to the vectorized quantum controller 503 to indicate that the qubit controller is configured to provide the stimulation. In such embodiments, the vectorized quantum controller 503 can provide the trigger signal in response to the acknowledgement signal.

Consistent with disclosed embodiments, qubits (e.g., qubit 507A and qubit 507B) can be implemented using superconducting quantum circuits. Such qubits can be based on currents (e.g., flux qubits) or charges (e.g., charge qubits), or energy (e.g., phase qubits). Different implementations can have different characteristics, such as sensitivity to external noise, coherence time, or anharmonicity. For example, a transmon qubit, a type of charge qubit including a capacitively shunted Josephson junction, can exhibit a reduced sensitivity to charge noise. As an additional example, fluxonium qubit, a type of flux qubit including a Josephson junction shunted by a capacitor and an inductor (the latter realizable using an array of additional Josephson junctions), can exhibit long coherence times and large anharmonicity. The disclosed embodiments are not limited to any particular qubit implementation. In some embodiments, multiple qubits can be implemented using a single superconducting circuit. In some embodiments, the qubits are the superconducting qubits that includes a Josephson junction and a non-Josephson junction area. The non-Josephson junction area includes a zero-th layer of superconducting material, the zero-th layer of superconducting material being superconducting material deposited on the non-Josephson junction area before ion milling of the Josephson junction and the non-Josephson junction area during preparation of the superconducting qubit.

In some embodiments, qubits can be configured to receive control signals from a qubit controller and provide readout output signals to the qubit controller. The control signals can include in-phase and quadrature pulse envelopes or DC bias waveforms. In some embodiments, the waveforms can be or modulate microwave signals that are provided to the qubits. The readout output signal can be generated in response to a probe signal provided by the qubit controller. For example, the readout signal can be a dispersive readout signal encoding information about the state of the qubit.

As described herein, the qubit controller can be provisioned with stored waveforms. In some embodiments, the qubit controllers can communicate with vectorized quantum controller 503 to receive the waveforms. In various embodiments, the qubit controllers can communicate with computing device 501 (or another computing device) to receive the waveforms. As a non-limiting example, the waveform generator(s) of a qubit controller can be connected to computing device 501 (or another computing device) using a bus or network. This separate connection can be used to load waveforms into the memor(ies) of the waveform generator(s).

The embodiments may further be described using the following clauses:

1. A superconducting qubit, comprising:
    a Josephson junction and a non-Josephson junction area, wherein the non-Josephson junction area comprises a first layer of superconducting material, the first layer of superconducting material being superconducting material deposited on the non-Josephson junction area before ion milling on the Josephson junction and the non-Josephson junction area during preparation of the superconducting qubit.
2. The superconducting qubit according to clause 1, wherein the superconducting material of the first layer of superconducting material comprises one or more of aluminum, tantalum, niobium, or titanium nitride.
3. The superconducting qubit according to clause 1 or 2, wherein after the ion milling on the Josephson junction and the non-Josephson junction area, the Josephson junction comprises a Josephson junction first layer electrode deposited from a second layer of superconducting material, a Josephson junction insulating layer, and a Josephson junction second layer electrode deposited from a third layer of superconducting material.
4. The superconducting qubit according to clause 3, wherein both the second layer of superconducting material and the third layer of superconducting material comprise one or more of aluminum, tantalum, niobium, or titanium nitride.
5. The superconducting qubit according to clause 3 or 4, wherein the Josephson junction insulating layer comprises one of an oxide layer, a physical vapor deposition (PVD) coating, a chemical vapor deposition (CVD) coating, or an atomic layer deposition (ALD) deposition film.
6. The superconducting qubit according to any one of clauses 1 to 5, wherein the Josephson junction has a cross shape.
7. A preparation method of a superconducting qubit using a mask structure used to
determine a Josephson junction and a non-Josephson junction area, comprising:
depositing a first layer of superconducting material on the non-Josephson junction area;
performing ion milling on the Josephson junction and the non-Josephson junction area;
preparing a Josephson junction first layer electrode, a Josephson junction insulating layer, and a Josephson junction second layer electrode; and
removing the mask structure to obtain the superconducting qubit.
8. The method according to clause 7, wherein the material of the mask structure comprises one or more of photoresist, electron beam lithography (EBL) photoresist, and inorganic material.
9. The method according to clause 7 or 8, wherein, depositing the first layer of superconducting material on the non-Josephson junction area comprises:
in a spatial XYZ coordinate system where the superconducting qubit is located, depositing the first layer of superconducting material in an X-Y plane in a direction that is at a first angle with an X axis and at a second angle with a Z axis, so that the Josephson junction is prevented from the superconducting material due to shadow effect of the mask structure and, while the superconducting material is deposited on the non-Josephson junction area.
10. The method according to clause 9, wherein the Josephson junction has a cross shape, and one leg of the cross shape is parallel to the X axis.
11. The method according to clause 9 or 10, wherein preparing the Josephson junction first layer electrode comprises:
depositing a second layer of superconducting material in the X-Y plane in a direction parallel to the X axis and at a third angle with the Z axis.
12. The method according to any one of clauses 7 to 11, wherein preparing the Josephson junction insulating layer comprises one of:
producing an oxide;
forming a PVD coating;
synthesizing a CVD coating; or
forming an ALD deposition film.
13. The method according to any one of clauses 7 to 11, wherein preparing the Josephson junction second layer electrode comprises:
depositing a third layer of superconducting material in the X-Y plane in a direction parallel to the Y axis and at a fourth angle with the Z axis.
14. The method according to any one of clauses 7 to 13, wherein the superconducting materials used by the first layer of superconducting material, the first layer electrode, and the second layer electrode comprise one or more of aluminum, tantalum, niobium, or titanium nitride.
15. A quantum storage device, comprising: a superconducting qubit, wherein the superconducting qubit is prepared by the method according to any one of clauses 7 to 14.
16. A quantum computer, comprising: a superconducting qubit, wherein the superconducting qubit is prepared by the method according to any one of clauses 7 to 14.
17. A quantum computer, comprising:
the superconducting qubit of any one of clauses 1 to 6.
18. The quantum computer of clause 17, further comprising a quantum storage device and a quantum effector, wherein both the quantum storage device and the quantum effector conduct quantum manipulation through a quantum state constituted by the superconducting qubit.
19. The quantum computer of clause 17, further comprising a quantum transistor, a quantum storage device, and a quantum effector, wherein the quantum transistor is configured to realize a switching function of a transistor, the quantum storage device is configured to store quantum computing information, and the quantum effector is configured to control quantum algorithms and quantum codes, and wherein the quantum transistor, the quantum storage device, and the quantum effector conduct quantum manipulation through a quantum state constituted by the superconducting qubit.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the disclosure disclosed herein. It is intended that the specification and examples be considered as exemplary only, with a true scope and spirit of the disclosure being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

It should be understood that the disclosed technical content may be implemented in other ways. The apparatus embodiments described above are only schematic. For example, the division of the units is only a logical function division. In actual implementations, there may be another division manner. For example, multiple units or components may be combined or integrated into another system, or some features can be ignored or not implemented. In addition, the displayed or discussed mutual coupling or direct coupling or communication connection may be indirect coupling or communication connection through some interfaces, units, or modules, which may be in electrical or other forms.

The units described as separate components may or may not be physically separated, and the components displayed as units may or may not be physical units, that is, they may be located in one place or may be distributed to a plurality of network units. Part of or all the units may be selected according to actual needs to achieve the purpose of the solution of the present embodiment.

In addition, the functional units in various embodiments of the present disclosure may be integrated into one processing unit, or each unit may exist alone physically, or two or more units may be integrated into one unit. The integrated units described above may be implemented either in the form of hardware or in the form of a software functional unit.

If the integrated units are implemented in the form of a software functional unit and sold or used as an independent product, they may be stored in a quantum computer-readable storage medium. Based on such an understanding, the technical solutions of the present disclosure essentially, or the part making contributions to the prior art, or all or part of the technical solutions may be embodied in the form of a software product. The quantum computer software product is stored in a storage medium and includes several instructions used for causing a quantum computer device to execute all or part of steps of the methods in various embodiments of the present disclosure.

The above are only preferred implementations of the present disclosure. It should be pointed out that, for those of ordinary skill in the art, several improvements and retouches may further be made without departing from the principles of the present disclosure. These improvements and retouches should also be regarded as the scope of protection of the present specification.

In the drawings and specification, there have been disclosed exemplary embodiments. However, many variations and modifications can be made to these embodiments. Accordingly, although specific terms are employed, they are used in a generic and descriptive sense only and not for purposes of limitation.

What is claimed is:

1. A superconducting qubit, comprising:
a Josephson junction and a non-Josephson junction area electrically connected, wherein the non-Josephson junction area comprises a first layer of superconducting material, a second layer of superconducting material, a Josephson junction insulating layer, and a third layer of superconducting material from bottom to top;
the Josephson junction comprises a Josephson junction first layer electrode deposited from the second layer of superconducting material and a Josephson junction second layer electrode deposited from the third layer of superconducting material, wherein the Josephson junction first layer electrode and the Josephson junction second layer electrode are crossed, and a cross area of the Josephson junction first layer electrode and the Josephson junction second layer electrode comprises the second layer of superconducting material, the Josephson junction insulating layer, and a third layer of superconducting material from bottom to top.

2. The superconducting qubit according to claim 1, wherein the superconducting material of the first layer of superconducting material comprises one or more of aluminum, tantalum, niobium, or titanium nitride.

3. The superconducting qubit according to claim 1, wherein both the second layer of superconducting material and the third layer of superconducting material comprise one or more of aluminum, tantalum, niobium, or titanium nitride.

4. The superconducting qubit according to claim 1, wherein the Josephson junction insulating layer comprises one of an oxide layer, a physical vapor deposition (PVD) coating, a chemical vapor deposition (CVD) coating, or an atomic layer deposition (ALD) deposition film.

5. A quantum computer, comprising:
a quantum storage device configured to store quantum computing information; and
a quantum effector configured to control quantum algorithms and quantum codes, wherein both the quantum storage device and the quantum effector conduct a quantum manipulation through a quantum state constituted by a superconducting qubit, wherein the superconducting qubit comprises: a Josephson junction and a non-Josephson junction area electrically connected, wherein the non-Josephson junction area comprises a first layer of superconducting material, a second layer of superconducting material, a Josephson junction insulating layer, and a third layer of superconducting material from bottom to top; and the Josephson junction comprises a Josephson junction first layer electrode deposited from the second layer of superconducting material and a Josephson junction second layer electrode deposited from the third layer of superconducting material, wherein the Josephson junction first layer electrode and the Josephson junction second layer electrode are crossed, and a cross area of the Josephson junction first layer electrode and the Josephson junction second layer electrode comprises the second layer of superconducting material, the Josephson junction insulating layer, and a third layer of superconducting material from bottom to top.

6. The quantum computer of claim 5, further comprising:
a quantum transistor configured to realize a switching function of a transistor, wherein the quantum transistor, the quantum storage device, and the quantum effector conduct a quantum manipulation through a quantum state constituted by the superconducting qubit.

\* \* \* \* \*